US007163869B2

(12) United States Patent
Kim et al.

(10) Patent No.: US 7,163,869 B2
(45) Date of Patent: Jan. 16, 2007

(54) SHALLOW TRENCH ISOLATION STRUCTURE WITH CONVERTED LINER LAYER

(75) Inventors: Shin-Hye Kim, Suwon-si (KR); Min Kim, Seoul (KR); Seung-Jae Lee, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 85 days.

(21) Appl. No.: 10/947,481

(22) Filed: Sep. 22, 2004

(65) Prior Publication Data

US 2005/0167778 A1    Aug. 4, 2005

(30) Foreign Application Priority Data

Feb. 3, 2004    (KR) .................... 10-2004-0006980

(51) Int. Cl.
*H01L 21/76*    (2006.01)
(52) U.S. Cl. .................. 438/424; 438/221; 438/243; 438/244; 438/296; 438/420; 438/421; 438/425; 438/430; 438/435; 438/436; 438/437; 438/438; 438/439; 257/E21.546; 257/E21.549; 257/E21.573
(58) Field of Classification Search ............... 438/221, 438/420, 421, 425, 430, 436–438
See application file for complete search history.

(56) References Cited

U.S. PATENT DOCUMENTS

| 5,981,402 A | 11/1999 | Hsiao et al. ............... 438/756 |
| 6,309,924 B1* | 10/2001 | Divakaruni et al. ........ 438/243 |
| 6,426,272 B1 | 7/2002 | Fu et al. .................... 438/435 |
| 6,509,232 B1 | 1/2003 | Kim et al. .................. 438/264 |
| 2002/0123206 A1* | 9/2002 | Hong et al. ................ 438/424 |
| 2003/0013272 A1* | 1/2003 | Hong et al. ................ 438/437 |
| 2004/0198019 A1* | 10/2004 | Yasui et al. ................ 438/435 |

OTHER PUBLICATIONS

Korean Patent Application No. 10-2001-0074167 to Limbictorsengang et al., having Application date of Nov. 27, 2001 (w/ English Abstract page).

* cited by examiner

*Primary Examiner*—Michael Lebentritt
*Assistant Examiner*—Kyoung Lee
(74) *Attorney, Agent, or Firm*—Monica H. Choi

(57) ABSTRACT

A STI (shallow trench isolation) structure is formed with a liner layer that is converted from an initial material to a subsequent material. For example, the liner layer is initially comprised of nitride during wet etch-back of a dielectric fill material comprised of oxide to protect an oxide layer on a semiconductor substrate. Thereafter, an exposed portion of the liner layer is converted into the subsequent material of oxide to protect the dielectric fill material within the STI opening during etching away of masking layers to prevent formation of dents in the STI structure.

24 Claims, 11 Drawing Sheets

SHALLOW TRENCH ISOLATION STRUCTURE WITH CONVERTED LINER LAYER

BACKGROUND OF THE INVENTION

This application claims priority to Korean Patent Application No. 2004-006980, filed on Feb. 3, 2004, in the Korean Intellectual Property Office, the disclosure of which is incorporated herein in its entirety by reference.

1. Field of the Invention

The present invention relates generally to IC (integrated circuit) fabrication, and more particularly, to a shallow trench isolation (STI) structure with a liner layer that is converted from an initial material to a subsequent material for preserving the integrity of IC structures associated with the STI structure.

2. Description of the Related Art

Isolation technology is important for electrically isolating adjacent IC (integrated circuit) devices fabricated in a semiconductor substrate, especially with demand for higher integration and capacity of IC devices. Shallow trench isolation (STI) is particularly suited for the fabrication of highly integrated IC devices.

For STI, a STI trench is formed to surround an active region of a semiconductor substrate, and the STI trench is filled with insulating material. Further for such STI, an oxide layer is formed on the walls of the STI trench formed in a silicon substrate. In addition, a liner layer typically comprised of thin silicon nitride is also formed at the walls of the STI trench. After formation of such layers at the walls of the STI trench, the STI trench is filled with oxide such as an HDP (high density plasma) oxide.

With such STI, 4-giga-bit NAND flash memory devices have been developed with an active region pitch that is less than 150 nm. In such a NAND flash memory device, the width of the STI trench is a few tens of nanometers (such as 76 nm for example). Since the active region pitch is less than 150 nm, the STI trench is not filled in a single fill step. Rather, a multi-step process is employed to fill such a narrow width STI trench in the flash memory device as well as in DRAM or SRAM memory devices with small critical dimensions.

In the multi-step process for filling the STI trench, a mask layer pattern is formed through masking layers typically comprised of a silicon nitride layer and an oxide layer formed on a semiconductor substrate. The mask layer pattern is used as an etch mask as the STI trench is etched through the semiconductor substrate by anisotropic dry etching.

Thereafter, a first oxide layer is formed on the walls of the STI trench by thermal oxidation. In addition, a liner layer comprised of silicon nitride is then deposited on any exposed surfaces. Thereafter, a medium temperature oxide (MTO) deposition is performed to deposit a second oxide layer on any exposed surfaces.

After deposition of such layers, the STI trench is filled with a first dielectric fill material comprised of HDP (high density plasma) oxide or undoped silicate glass (USG). Thereafter, a wet etch-back process is performed such that the first dielectric fill material partially fills the STI trench. Subsequently, a third oxide layer from medium temperature oxide (MTO) deposition is deposited. Thereafter, the STI trench is completely filled with a second dielectric fill material also comprised of HDP oxide or USG.

In summary, the STI structure is formed by the multi-step process for filling the STI trench as follows: (1) STI trench formation→(2) first oxide layer by thermal oxidation of STI trench sidewall→(3) liner layer of silicon nitride→(4) second oxide layer by MTO deposition→(5) first dielectric fill material of HDP oxide or USG→(6) wet etch-back of first dielectric fill material→(7) third oxide layer by MTO deposition (may be omitted)→(8) second dielectric fill material of HDP oxide layer or USG.

Unfortunately, with the STI liner of silicon nitride, a dent is formed in the STI structure of the prior art from wet etching of the nitride layer forming the mask layer pattern. FIG. 1A shows an STI structure 20 of the prior art comprised of a dielectric fill material 22 within a STI trench 24. The dielectric fill material 22 is typically comprised of multiple fill materials formed in separate deposition steps in the multi-step process for filling the STI trench 24.

The STI trench 24 is patterned by etching through the semiconductor substrate 28 according to the opening in the mask layer pattern formed with an oxide layer 30 and a nitride layer 32. For simplicity in FIG. 1A, assume that a first oxide layer 34 and a liner layer 36 of silicon nitride are formed at the walls of the STI trench 24. Such layers 34 and 36 are formed at the walls of the STI trench 24 before the dielectric fill material 22 is deposited into the STI trench 24.

Referring to FIG. 1B, as the nitride layer 32 of the mask layer pattern is etched away in a wet-etch process, the top portion of the liner layer 36 also comprised of nitride is etched away. Thus, during any subsequent etch process for etching oxide, the exposed sidewall of the dielectric fill material 22 is etched away to form dents 38.

Such dents 38 cause deleterious effects and even failure in an adjacent transistor. Relative to DRAM or SRAM memory devices, a flash memory device is especially vulnerable to degradation of production yield from formation of such dents 38.

More specifically, for the transistor formed adjacent to any of such dents 38, the transistor exhibits a hump phenomenon whereby the transistor undesirably turns on, or whereby the threshold voltage of the transistor is decreased. In addition, bridging may occur in adjacent gate electrodes of transistors from residues of polysilicon comprising the gate electrodes of such transistors within the dents 38. In any case, the dents 38 deteriorate the electrical characteristics of the integrated circuit.

Therefore, especially for flash memory devices, the STI structure is desired to be formed with the liner layer 36 not being comprised of silicon nitride. An example process for forming such a STI structure includes the following steps: (1) STI trench formation→(2) forming a first oxide layer from thermal oxidation at walls of the STI trench→(3) forming a second oxide layer from MTO deposition→(4) filling the STI trench with a first dielectric fill material of HDP oxide or USG→(5) wet etch-back such that the first dielectric fill material partially fills the ST trench→(6) forming a third oxide layer from MTO deposition (may be omitted)→(7) filling the STI trench with a second dielectric fill material of HDP oxide or USG.

Unfortunately, a disadvantage of using just the oxide layers at the walls of the STI trench is that during the wet-etch process of step (5) above, a high-voltage (HV) oxide layer is damaged by the wet etch as illustrated in FIGS. 2A and 2B. Elements having the same reference number in FIGS. 1A and 2A refer to elements having similar structure and/or function. FIG. 2A shows a STI structure 40 formed with an oxide layer 42 formed at walls of the STI trench 24. The oxide layer 42 may be formed from multiple deposition processes with multiple oxide layers. A first dielectric fill material 44 is deposited to fill the STI trench 24 as in step (4) above.

Referring to FIGS. 2A and 2B, a wet etch-back is performed such that the first dielectric fill material 44 partially fills the STI trench 24, as in step (5) above. Typically, the first dielectric fill material 44 is comprised of an oxide. Thus, during the wet etch-back for etching the first dielectric fill material 44, the upper portion of the oxide layer 42 is also etched away. In addition, side portions 46 of the oxide layer 30 forming the mask layer pattern are also etched away from being exposed in FIG. 2B. The oxide layer 30 of the mask layer pattern may also form the HV (high voltage) gate dielectric for transistors in a peripheral circuit region of a memory device. In that case, such etching of the side portions 46 of the HV oxide layer 30 results in operational degradation of such transistors.

Thus, a mechanism for forming an STI structure is desired with preservation of the integrity of the IC structures 22 of FIGS. 1B and 30 of FIG. 2B.

SUMMARY OF THE INVENTION

Accordingly, a STI structure is formed with a liner layer that is converted from an initial material to a subsequent material for preserving the integrity of IC structures associated with the STI structure.

In a general aspect of the present invention, for forming a STI (shallow trench isolation) structure, a STI opening is formed within a semiconductor substrate. In addition, a liner layer comprised of an initial material is formed at walls of the STI opening. The STI opening is then filled with a first dielectric fill material. An etch-back of the first dielectric fill material is performed to expose an upper portion of the liner layer and such that the first dielectric fill material partially fills the STI opening. The exposed upper portion of the liner layer is then converted to be comprised of a subsequent material different from the initial material.

In another embodiment of the present invention, the STI opening is filled with a second dielectric fill material such that the first and second dielectric fill materials completely fill the STI opening.

In a further embodiment of the present invention, a thermal oxidation process is performed to form a first oxide layer at the walls of the STI opening when the semiconductor substrate is comprised of silicon, before the step of forming the liner layer.

In one embodiment of the present invention, a second oxide layer is also formed on the first oxide layer in a medium temperature oxide (MTO) deposition process, before the step of forming the liner layer. In that case, the liner layer is deposited on the second oxide layer.

In another embodiment of the present invention, the second oxide layer is formed on the liner layer in a medium temperature oxide (MTO) deposition process, after the step of forming the liner layer.

In a further embodiment of the present invention, the STI opening is etched through masking layers comprised of a layer of nitride and a layer of oxide deposited on the semiconductor substrate.

In one example embodiment of the present invention, the initial material of the liner layer is nitride, and the subsequent material of the upper portion of the liner layer is oxide. In that case, the liner layer comprised of the initial material has a thickness in a range of from about 10 Å (angstroms) to about 100 Å (angstroms), and the upper portion of the liner layer comprised of the subsequent material has a thickness in a range of from about 50 Å (angstroms) to about 500 Å (angstroms).

Further in that case, the exposed upper portion of the liner layer is oxidized with a radical to convert the exposed upper portion of the liner layer into oxide from nitride. A source gas for the oxidizing radical includes one of a mixture of hydrogen and oxygen or a mixture of hydrogen, oxygen, and hydrogen chloride. In addition, the step of oxidizing the exposed upper portion of the liner layer with a radical is performed with a pressure in a range of from about 1 milli-Torr to about 50 Torr and at a temperature in a range of from about 600° Celsius to about 1100° Celsius.

In yet another embodiment of the present invention, each of the first and second dielectric fill materials is comprised of one of HDP (high density plasma) oxide or USG (undoped silicate glass). In that case, the etch-back of the first dielectric fill material is performed in a wet etch-back process using an etching solution comprised of LAL (low ammoniumfluoride liquid), SC-1 solution, or an HF solution.

In this manner, the liner layer is comprised of the initial material of nitride during the wet etch-back of the first dielectric fill material comprised of oxide. Such a liner layer of nitride protects any oxide layer comprising the masking layers on the semiconductor substrate during the wet etch-back of the first dielectric fill material. Thereafter, the exposed upper portion of the liner layer is converted into the subsequent material of oxide. Such a converted upper portion of the liner layer protects the sidewalls of the dielectric fill material within the STI opening during etching away of any nitride layer comprising the masking layers on the semiconductor substrate to prevent formation of dents for the STI structure.

BRIEF DESCRIPTION OF THE DRAWINGS

The above and other aspects and advantages of the present invention will become more apparent when described in detailed exemplary embodiments thereof with reference to the attached drawings in which.

The figures referred to herein are drawn for clarity of illustration and are not necessarily drawn to scale. Elements having the same reference number in FIGS. 1, 2, 3, 4, 5, 6, 7, 8, 9, 10, 11, 12, 13, 14, 15, 16, 17, 18, and 19 refer to elements having similar structure and/or function.

DETAILED DESCRIPTION OF THE INVENTION

Figure 1A:
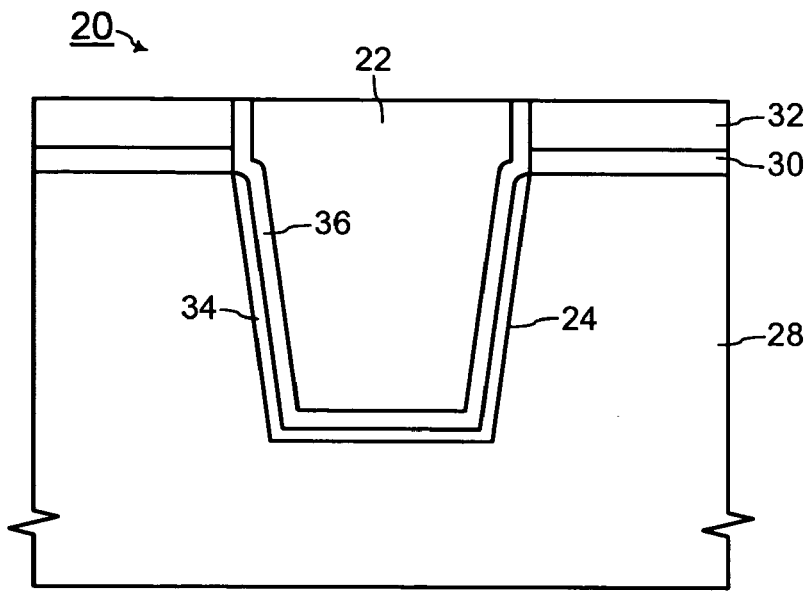
FIGS. 1A and 1B are cross-sectional views of a STI structure with dents formed when a liner layer is comprised of nitride, according to the prior art.
Figure 1B:
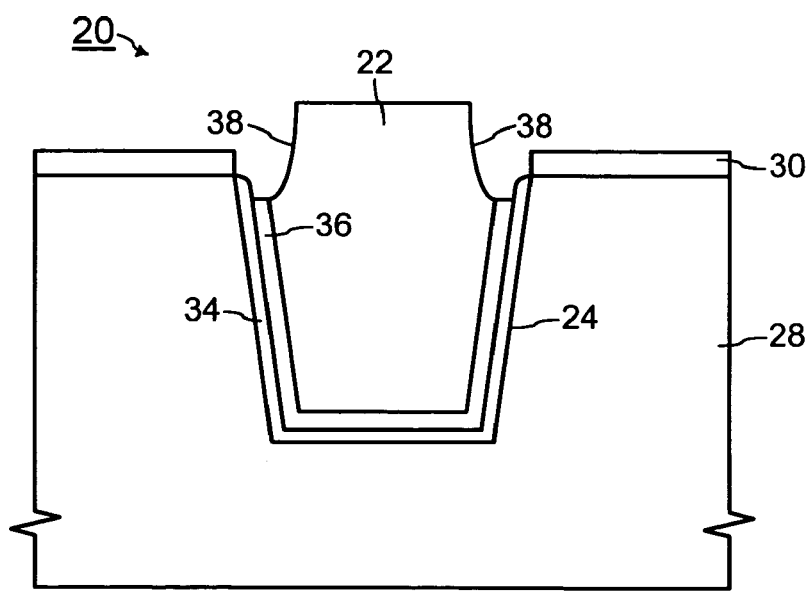
Figure 2A:
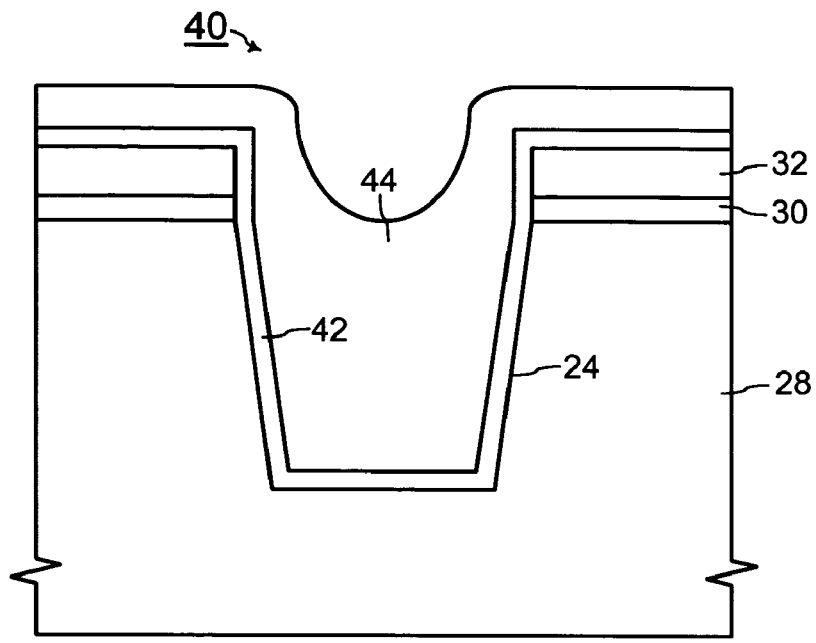
FIGS. 2A and 2B are cross-sectional views of a STI structure with etching away of side portions of an oxide layer formed as a mask pattern on the semiconductor substrate when a liner layer is comprised of oxide, according to the prior art.
Figure 2B:
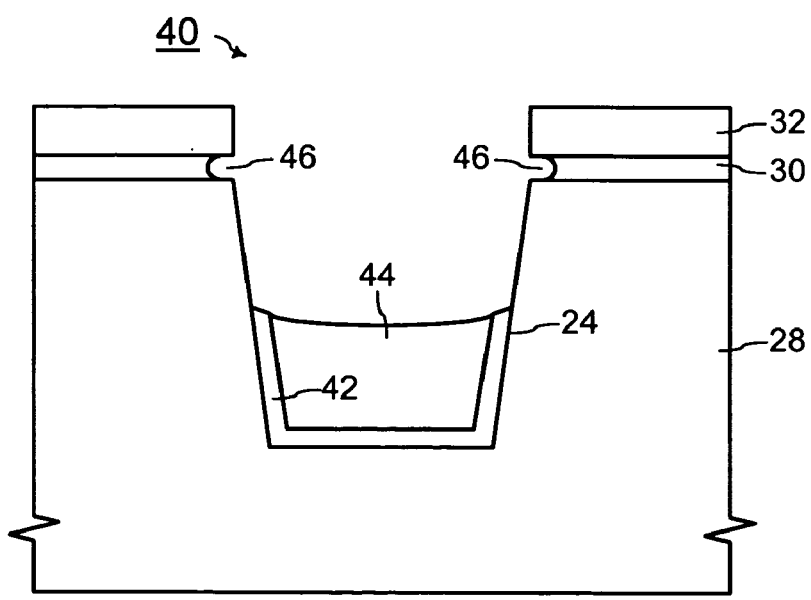
Figure 3:
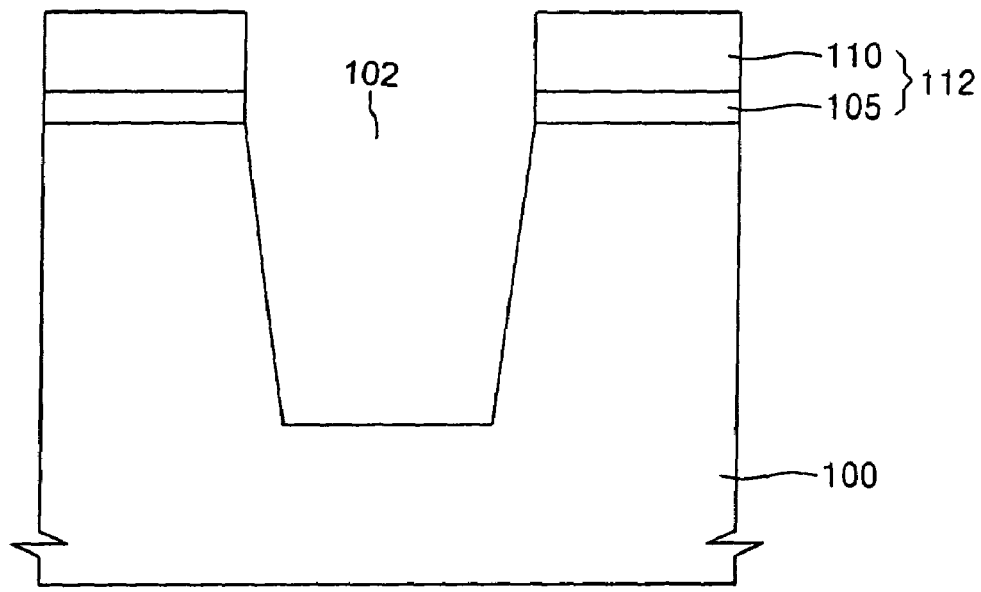
FIGS. 3 through 11 show cross-sectional views for illustrating formation of a STI structure with a liner layer that is converted from an initial material to a subsequent material for preserving the integrity of IC structures associated with the STI structure, according to an embodiment of the present invention.

Referring to FIG. 3, an oxide ($SiO_2$ for example) layer 105 and a nitride (SiN for example) layer 110 form masking layers sequentially formed on a semiconductor substrate 100. The oxide layer 105 and the nitride layer 110 are patterned by a photo etch process to form an opening 102 through such layers 110 and 105. The layers 110 and 105 with the opening 102 form a mask layer pattern 112 for defining an active region on the semiconductor substrate 100.

FIG. 3 illustrates for example a cell region of a flash memory device or a peripheral circuit region of the flash memory device having the oxide layer 105 as a HV gate oxide layer on the semiconductor substrate 100. Using the mask layer pattern 112 as an etch mask, the semiconductor substrate 100 is anisotropically dry-etched to form a STI opening 102 through the semiconductor substrate 100. The STI opening 102 is formed as a STI trench in one embodiment of the present invention. However, the present invention may be practiced when the STI opening 102 is any other type of opening formed through the semiconductor substrate 100.

In one embodiment of the present invention, the sidewalls of the STI trench 102 may have a positive slope depending on the etch characteristics. With such sloping of the sidewalls of the STI trench 102, the upper width of the STI trench 102 is greater than the lower width of the STI trench 102.

Figure 4:
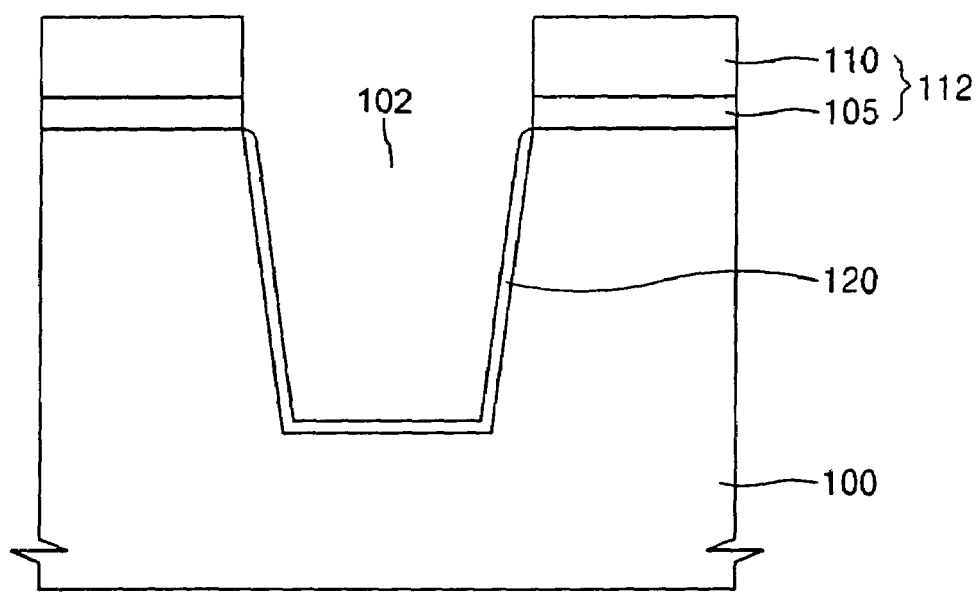

Referring to FIG. 4, a first oxide layer 120 is formed on the walls of the STI trench 102. The first oxide layer 120 is formed by thermal oxidation at the walls of the STI trench 102 when the semiconductor substrate 100 is comprised of silicon, in one embodiment of the present invention. Such thermal oxidation may be by dry oxidation using $O_2$, or by wet oxidation using $H_2O$.

The first oxide layer 120 facilitates subsequent formation of another oxide layer or a nitride layer. In addition, the first oxide layer 120 repairs defects or damage on the silicon walls of the STI trench 102 resulting from a dry etching process for forming the STI trench 102. As will be further described, if an oxide layer from MTO (medium temperature oxide) deposition is formed, the process of forming the first oxide layer 120 may be omitted.

Figure 5:
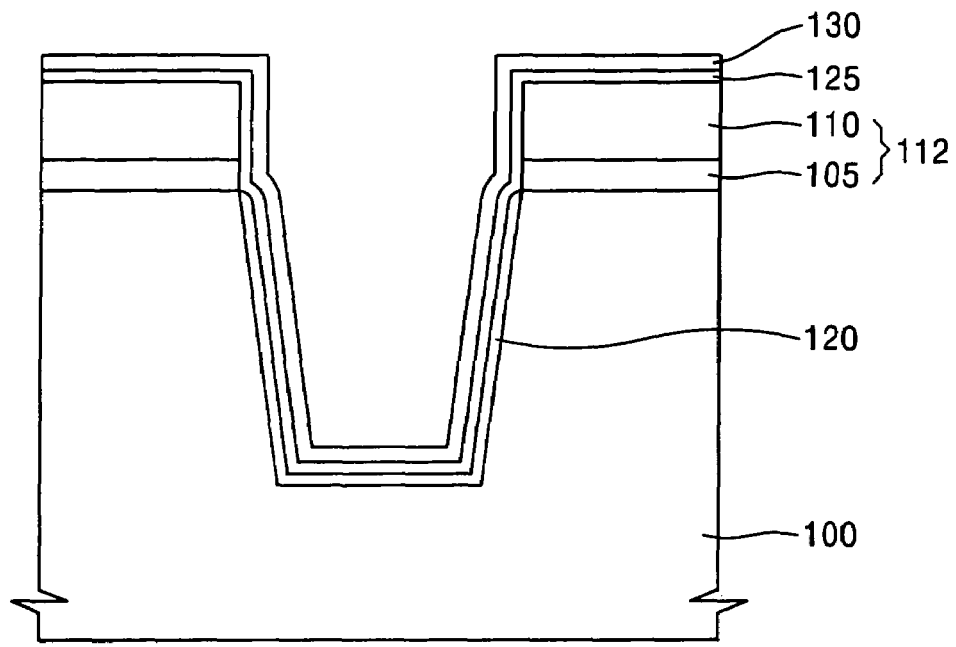

Thereafter, referring to FIG. 5, a second oxide layer 125 is formed by MTO (medium temperature oxide) deposition in one embodiment of the present invention. The second oxide layer 125 is conformally deposited on exposed surfaces including on the first oxide layer 120. Subsequently in FIG. 5, a liner layer 130 is deposited on the second oxide layer 125. The liner layer 130 is comprised of silicon nitride having a thickness in a range of from about 10 Å (angstroms) to about 100 Å (angstroms), in one embodiment of the present invention.

Such a liner layer 130 prevents the silicon at the walls of the STI trench 102 from being further oxidized during subsequent processes. In addition, the liner layer 130 protects the oxide layer 105 which may be a HV gate oxide layer in the peripheral circuit region of a memory device. More specifically, during wet etch-back in the subsequent multi-step STI trench filling process, the liner layer 130 prevents etching of the HV gate oxide layer as will be illustrated and described later herein.

Figure 6:
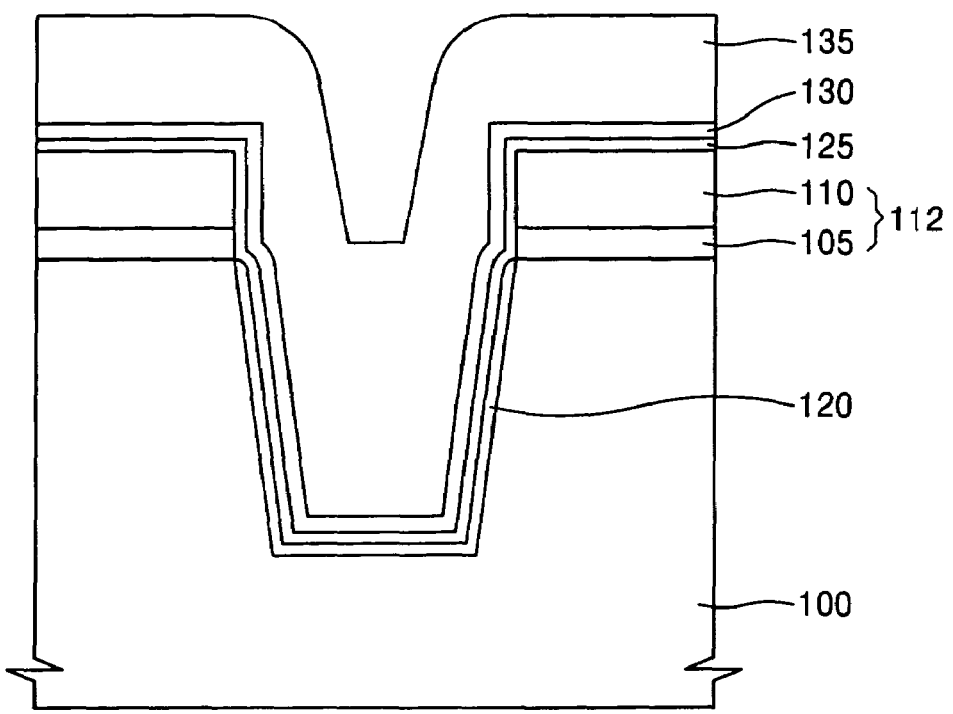

Referring to FIG. 6, a first dielectric fill material 135 is deposited on the liner layer 130 to fill the STI trench 102. The first dielectric fill material 135 is comprised of an insulating material suitable for filling the STI trench 102, which typically has a relatively narrow width and a high aspect ratio. Because of higher difficulty in filling the STI trench 102 with lower width and higher aspect ratio, the gap fill of the STI trench 102 is performed in a plurality of steps for the STI trench 102 that is relatively narrow. The first dielectric fill material 135 is comprised of USG (undoped silicate glass) or HDP (high density plasma) oxide, in one embodiment of the present invention.

Figure 7:
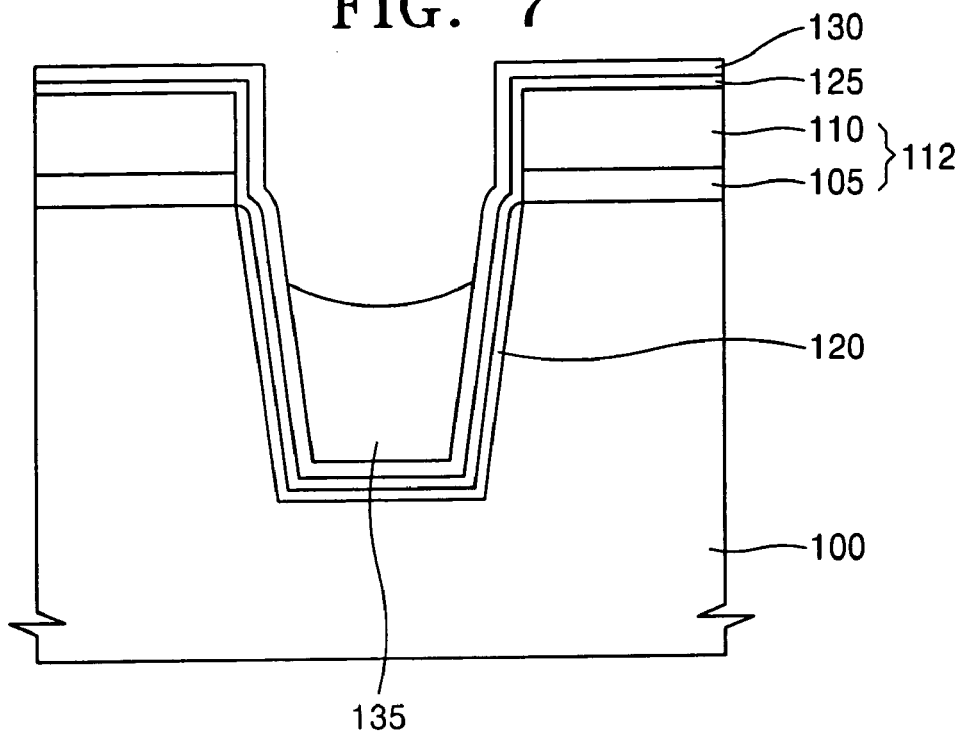

Thereafter, referring to FIG. 7, a wet etch-back process is performed to etch away a top portion of the first dielectric fill material 135. As a result, the first dielectric fill material 135 partially fills a bottom portion of the STI trench 102, and a top portion of the liner layer 130 becomes exposed as illustrated in FIG. 7.

The etching solution used for the wet etch-back process in FIG. 7 is comprised of SC-1 (standard cleaning-1) solution including $H_2O_2$, $NH_4OH$ and $H_2O$, in one embodiment of the present invention. Alternatively, the etching solution used for the wet etch-back process in FIG. 7 is comprised of a LAL (low ammoniumfluoride liquid) or a HF (hydrogen fluoride) solution.

Figure 8:
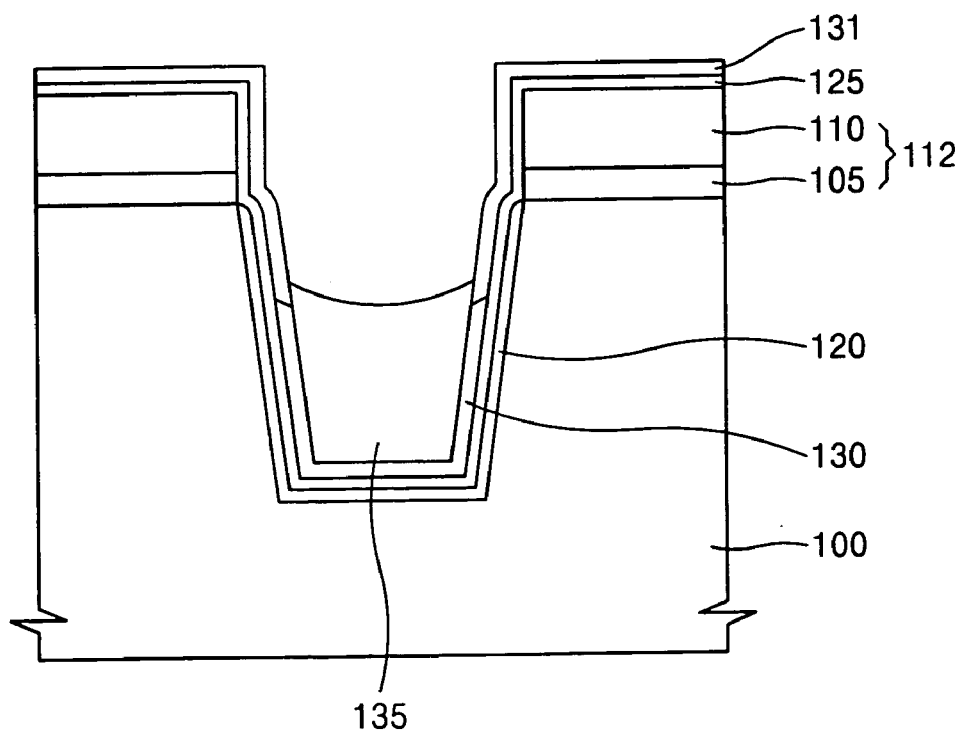

Referring to FIG. 8, according to a general aspect of the present invention, an oxidation process using a radical is performed on the exposed upper portion 131 of the liner layer. As a result, initially in FIG. 7, the exposed upper portion of the liner layer 130 is comprised of the initial material of nitride (SiN for example). After the oxidation process using a radical in FIG. 8, the exposed upper portion 131 of the liner layer is converted to be comprised of a subsequent material of an oxide ($SiO_2$ for example).

The source gas for forming such a radical in the oxidation process for converting the exposed upper portion 131 includes a mixture of $H_2$ and $O_2$, in one embodiment of the present invention. Alternatively, such a source gas includes a mixture of $H_2$, $Cl_2$, and $O_2$. The oxidation process for converting the exposed upper portion 131 of the liner layer is performed under a pressure in a range of from about 1 milli-Torr to about 50 Torr and at a temperature in a range of from about 600° Celsius to about 110° Celsius, in one embodiment of the present invention.

A thickness of the converted exposed upper portion 131 of the liner layer is increased from before the oxidation process. For example, the liner layer 130 comprised of the initial material of nitride in FIG. 7 has a thickness in a range of from about 10 Å to about 100 Å before the oxidation process using a radical. Thereafter, the converted upper portion 131 of the liner layer comprised of the subsequent material of oxide in FIG. 8 has a thickness in a range of from about 50 Å to about 500 Å after the oxidation process using a radical.

The oxidation process using a radical is performed in a single type or a batch type process. In the single type process, one semiconductor substrate 100 is placed within a reaction chamber for the oxidation process using a radical. In the batch type process, a batch of multiple semiconductor substrates is placed within the reaction chamber for the oxidation process using a radical.

As will be described later herein, the oxidation of the exposed upper portion 131 of the liner layer in FIG. 8 prevents generation of dents in the dielectric fill material within the STI trench 102 during a subsequent process of removing the mask layer pattern 112. On the other hand, when the whole liner layer 130 is comprised of silicon nitride during the wet etch-back process in FIG. 7, the oxide layer 105 at the sidewalls of the STI trench 102 is protected by the liner layer 130 from the etch solution for etching oxide. Thus, the structural integrity of the oxide layer 105 which may be a HV gate oxide for a peripheral circuit in a memory device is preserved in FIG. 7.

Figure 9:
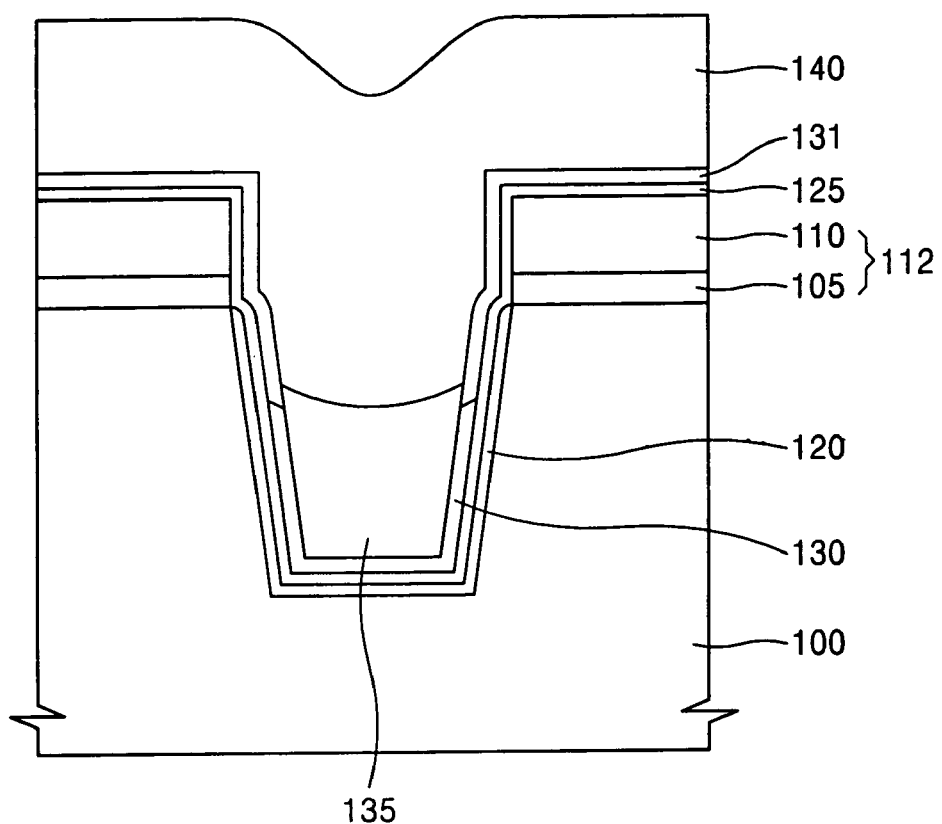

Referring to FIG. 9, a second dielectric fill material 140 is conformally deposited to completely fill the STI trench 102. In an alternative embodiment of the invention, a layer of oxide from MTO (medium temperature oxide) deposition may be formed before the second dielectric fill material 140 is deposited. Because the first dielectric fill material 135 partially fills the bottom portion of STI trench 102, the aspect ratio of the STI trench 102 is lower such that the second dielectric fill material 140 more easily completely fills the STI trench 102 without generation of defects such as voids or the like.

Figure 10:
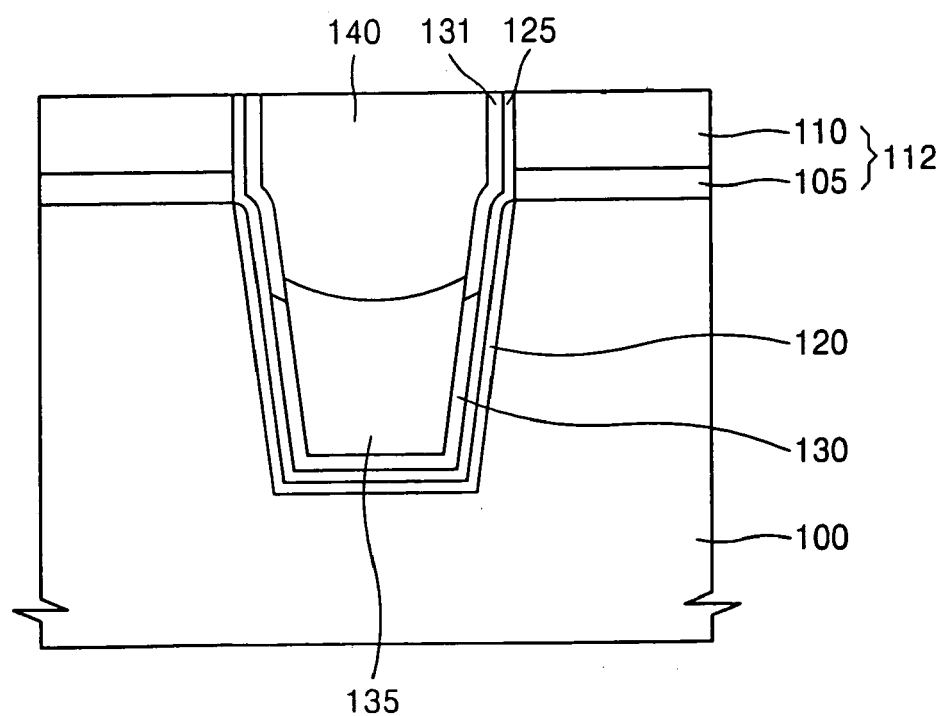

The second dielectric fill material 140 is comprised of USG (undoped silicate glass) or HDP (high density plasma) oxide, in one embodiment of the present invention. Thereafter referring to FIG. 10, a planarization process such as a CMP (chemical mechanical polishing) process is performed. The nitride layer 110 of the mask layer pattern 112 acts as a polish stop in the CMP process.

Figure 11:
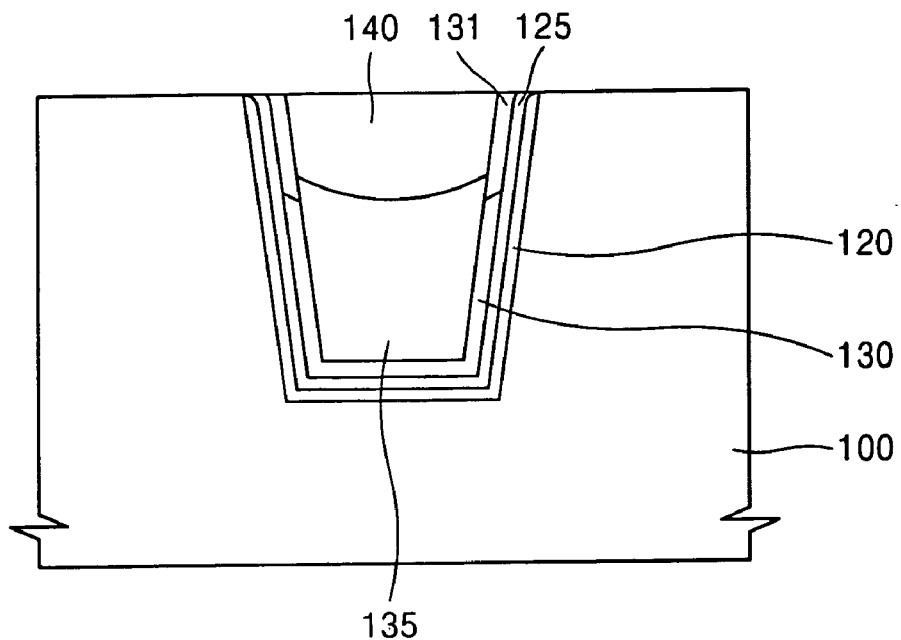

Referring to FIG. 11, using etching solutions such as a phosphoric acid solution and a HF solution, the nitride layer 110 is etched away. In FIG. 11, the oxide layer 105 of the mask layer pattern 112 is etched away in the case the trench 102 surrounds core cells of a flash memory device. Note that during such etching, top portions of the dielectric fill material 140, the second oxide layer 125, and the converted upper portion of the liner layer 131 are also etched away. On the other hand, if the STI trench 102 surrounds a peripheral circuit region of the flash memory device with the oxide layer 105 forming a HV gate oxide layer, the oxide layer 105 would not be etched away.

Figure 19:
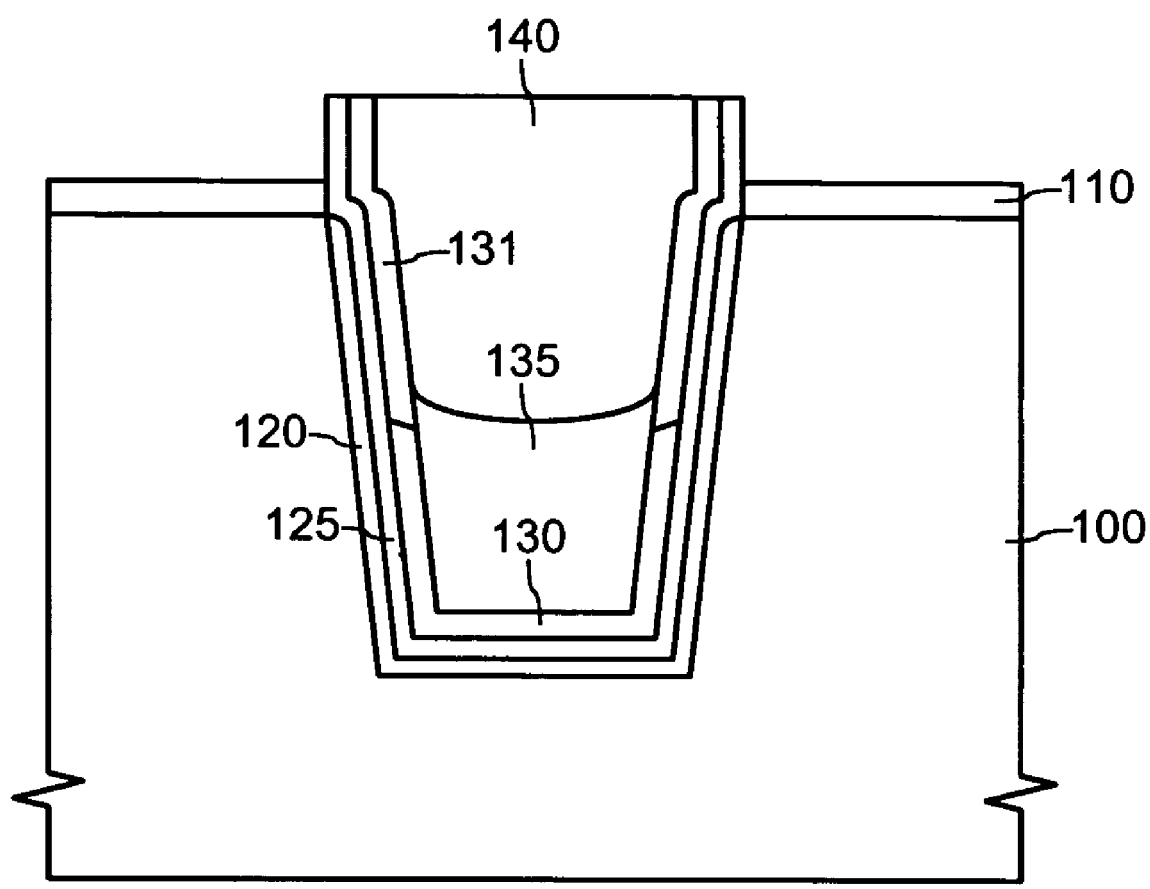
FIG. 19 shows a cross-sectional view of the STI structure of FIG. 10 during etching away of a layer of nitride forming masking layers on the semiconductor substrate, according to another embodiment of the present invention.

Referring to FIG. 19, the phosphoric acid solution in such etching removes just the layer of nitride 110 of the mask layer pattern 112. During such etching, because the upper portion 131 of the liner layer has been oxidized to be comprised of the subsequent material of oxide, the phosphoric acid solution does not etch such an oxidized upper portion 131 of the liner layer. Thus, the upper portion 131 of the liner layer remains to protect the side surfaces of the dielectric fill material 140 to prevent the generation of dents in the dielectric fill material 140.

In this manner, since the liner layer 130 is comprised of the initial material of silicon nitride, the HV oxide layer (which may be formed as the oxide layer 105) of a peripheral circuit of a memory device is protected from the wet etch-back of FIG. 7. On the other hand, since the upper portion 131 of the liner layer is oxidized to the subsequent material of oxide, the generation of dents in the STI structure during the etching of the mask pattern layers 112 is prevented. Furthermore, using the first and second dielectric fill materials 135 and 140 in multiple fill steps, the STI trench 102 having narrow width and high aspect ratio is more easily filled without defects.

FIGS. 12 to 18 show cross-sectional views for forming an STI structure according to another embodiment of the present invention. This alternative embodiment is different from the embodiment of FIGS. 3–11 in that the liner layer 130 of nitride is formed before the second oxide layer 125 is formed. The formation of first and second oxide layers 120 and 125 and liner layer 130 of nitride and the thicknesses thereof and the etching solution used for wet etch or wet etch-back processes are similar as those in the previous embodiment. Furthermore, the oxidation process using a radical for converting the upper portion 131 of the liner layer is similar as in the previous embodiment.

Figure 12:
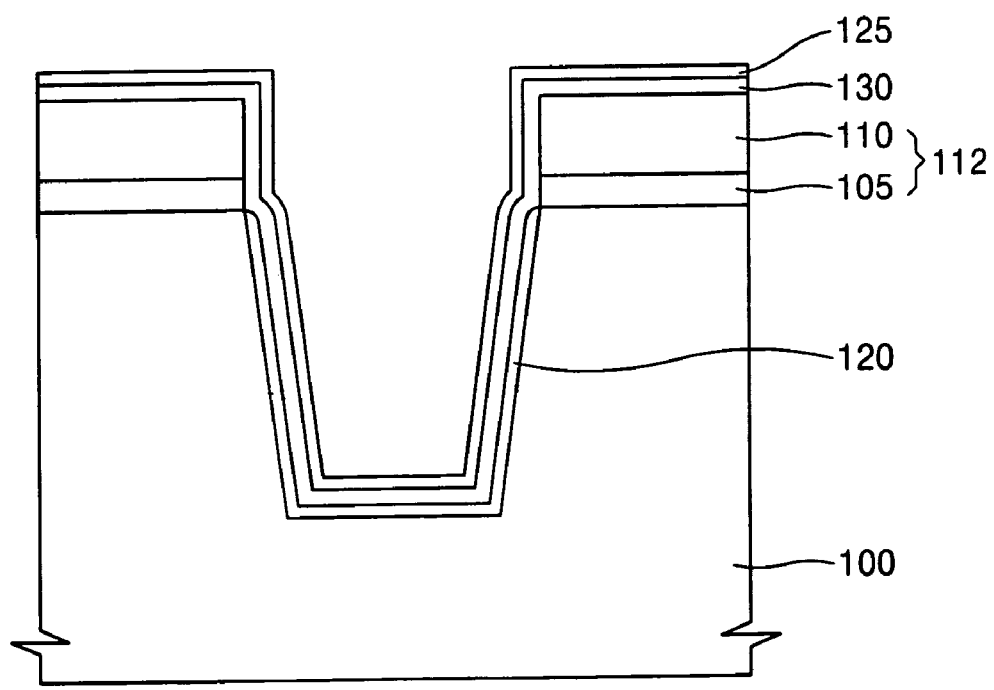
FIGS. 12 through 18 show cross-sectional views for illustrating formation of a STI structure with a liner layer that is converted from an initial material to a subsequent material for preserving the integrity of IC structures associated with the STI structure, according to another embodiment of the present invention.

Referring to FIG. 12 for this alternative embodiment, the mask layer pattern 112 including the oxide layer 105 and the nitride layer 110 is formed on the semiconductor substrate 100. Then, an anisotropic dry etch process is performed using the mask pattern layer as an etch mask to form the STI trench 102. Subsequently, the walls of the STI trench 102 comprised of silicon are thermally oxidized to form a first oxide layer 120. Thereafter, the liner layer 130 comprised of silicon nitride is conformally deposited. Subsequently, the second oxide layer 125 is deposited on the liner layer 130.

Figure 13:
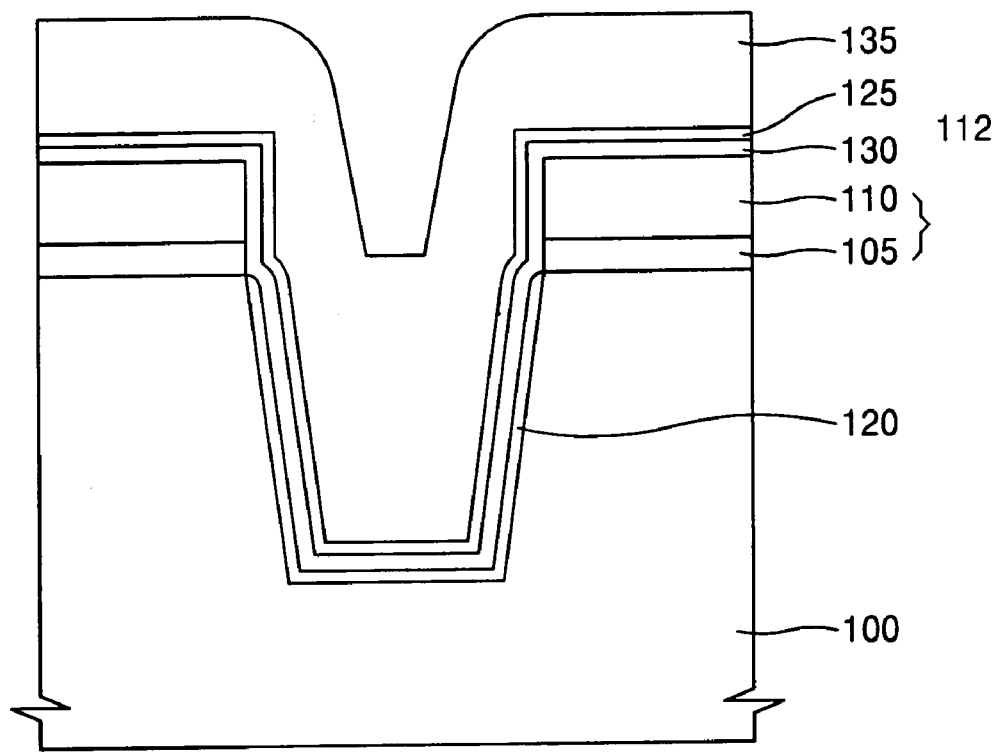
Figure 14:
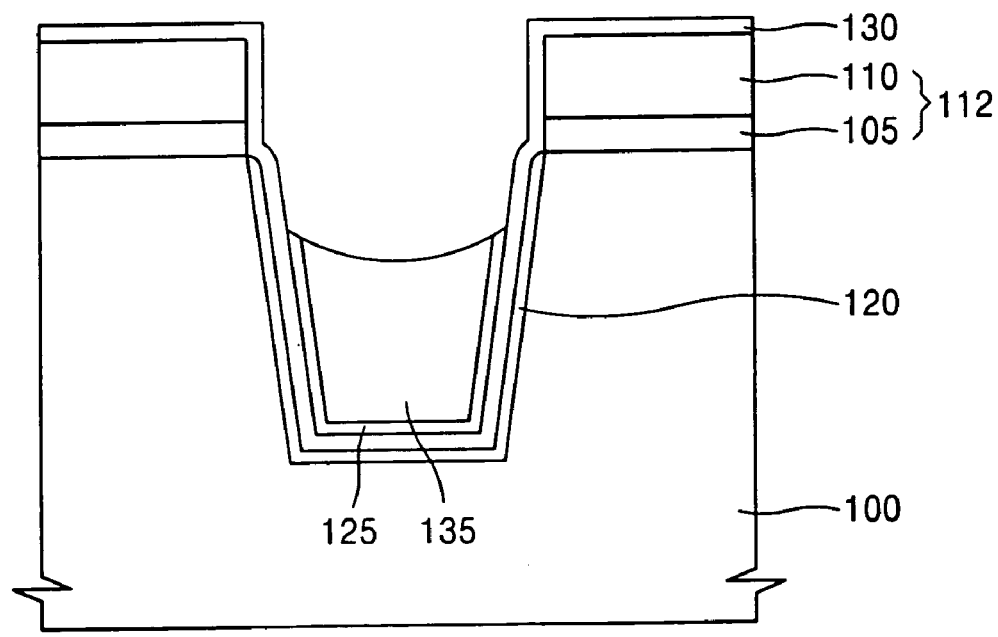

Referring to FIG. 13, the first dielectric fill material 135 is conformally deposited to fill the STI trench 102. Then, as shown in FIG. 14, a wet etch-back process is performed using a LAL, SC-1 or HF solution as an etchant, thereby removing a top portion of the first dielectric fill material 135 comprised of USG (undoped silicate glass) or HDP oxide. Additionally during such an etch-back process, the upper portion of the second oxide layer 125 that was disposed under the removed portion of the first dielectric fill material 135 is also etched away. As a result, an upper portion of the liner layer 130 is exposed as illustrated in FIG. 14 with the first dielectric fill material 135 partially filling the STI trench 102.

Figure 15:
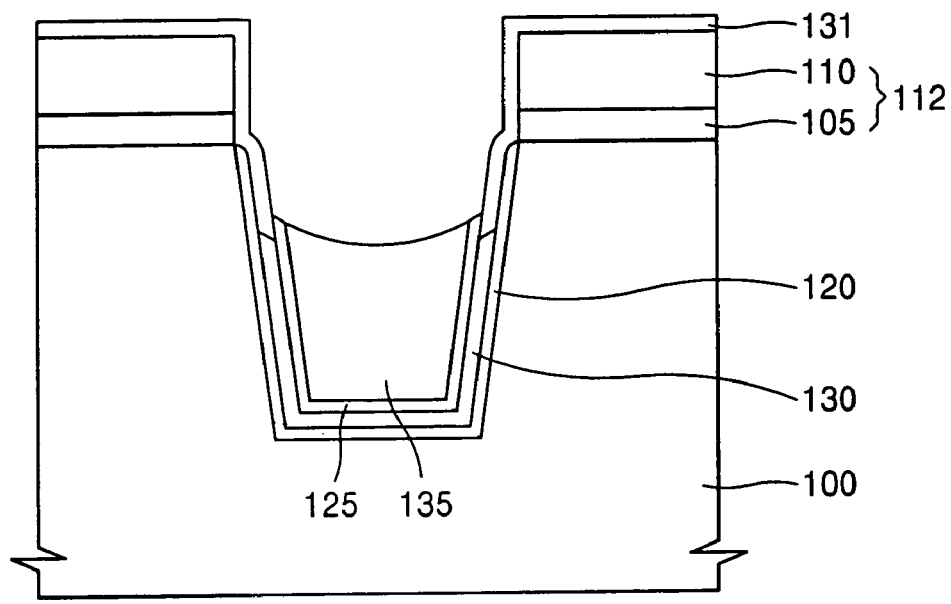
Figure 16:
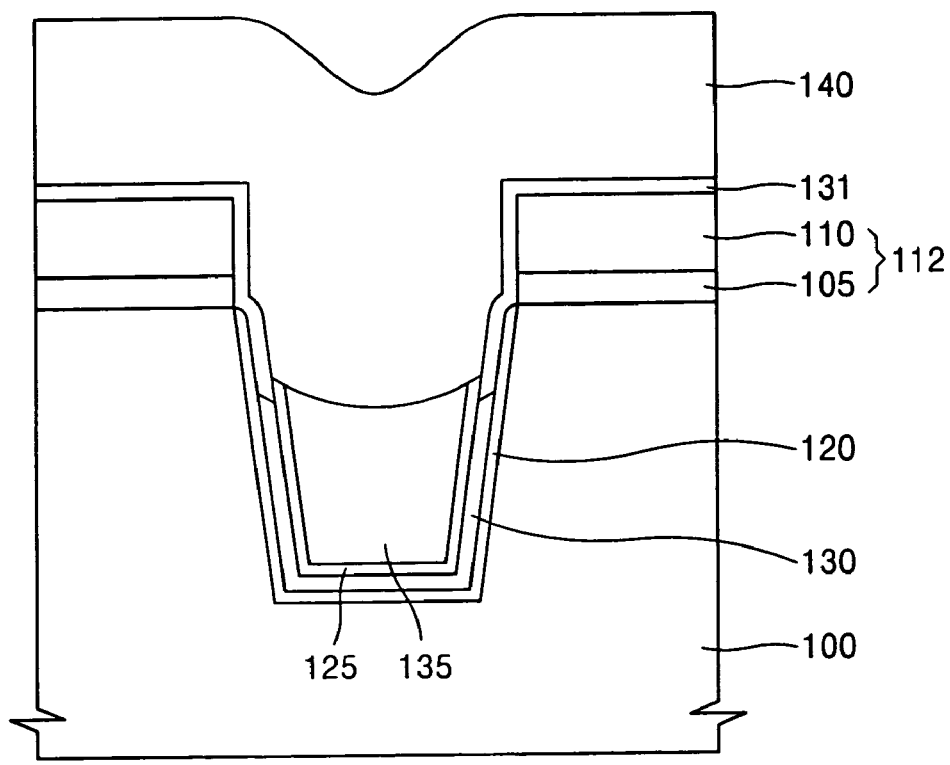
Figure 17:
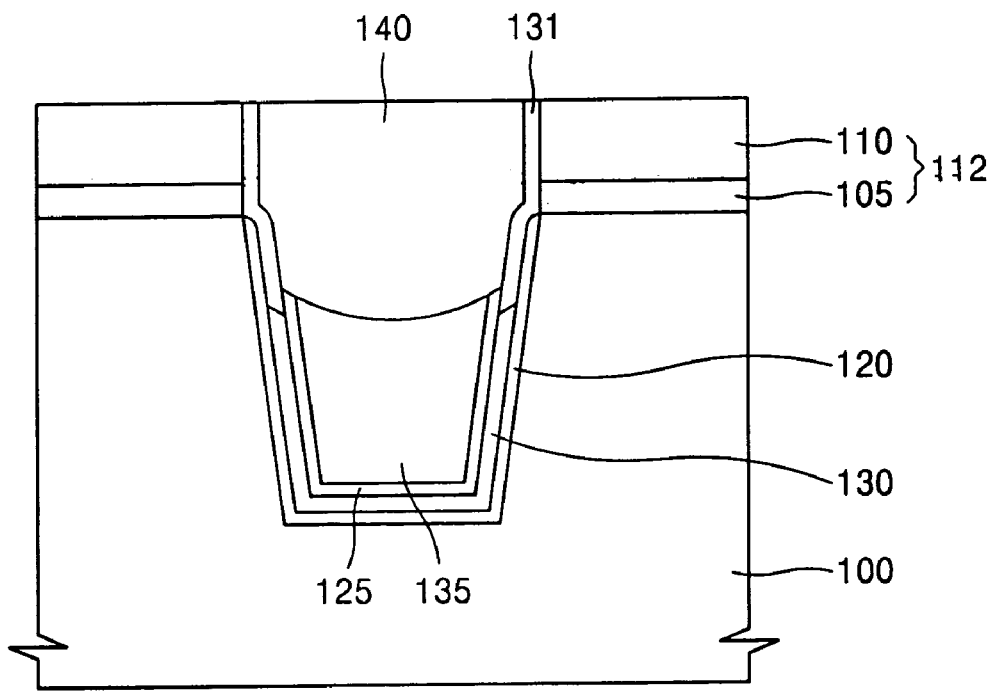

Referring to FIG. 15, using a radical from a source gas consisting of a mixture of $H_2$ and $O_2$ or a mixture of $H_2$, HCl and $O_2$, the exposed upper portion 131 of the liner layer is oxidized to the subsequent material of oxide. Then, referring to FIG. 16, a second dielectric fill material 140 is conformally deposited to completely fill the STI trench 102. Thereafter, referring to FIG. 17, a planarization process such as a CMP process is performed. Additionally referring to FIG. 18, a wet etch process is performed using a phosphoric acid solution and a HF solution to remove the mask layer pattern 112 and top portions of the dielectric fill material 140, the second oxide layer 125, and the converted upper portion of the liner layer 131.

Figure 18:
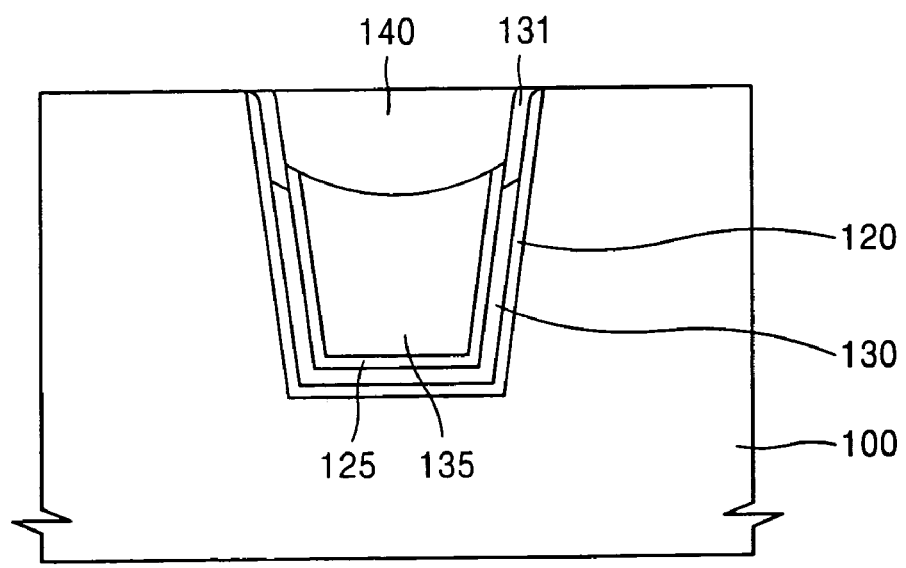

Similar to the previous embodiment of FIGS. 3–11, in the alternative embodiment of FIGS. 12–18, since the liner layer 130 is comprised of the initial material of silicon nitride, the HV oxide layer (which may be formed as the oxide layer 105) of a peripheral circuit of a memory device is protected from the wet etch-back of FIG. 14. On the other hand, since the upper portion 131 of the liner layer is oxidized to the subsequent material of oxide, the generation of dents in the STI structure during the etching of the mask pattern layers 112 in FIG. 18 is prevented. Furthermore, using the first and second dielectric fill materials 135 and 140 in multiple fill steps, the STI trench 102 having narrow width and high aspect ratio is more easily filled without defects.

While the present invention has been particularly shown and described with reference to exemplary embodiments thereof, it will be understood by those of ordinary skill in the art that various changes in form and details may be made therein without departing from the spirit and scope of the present invention as defined by the following claims.

What is claimed is:

1. A method of forming a STI (shallow trench isolation) structure, comprising:
   A. forming a STI opening within a semiconductor substrate;
   B. forming a liner layer comprised of an initial material at walls of the STI opening;

C. filling the STI opening with a first dielectric fill material;
D. performing an etch-back of the first dielectric fill material to expose an upper portion of the liner layer; and
E. converting the exposed upper portion of the liner layer to be comprised of a subsequent material, after the step D and not during the step D.

2. The method of claim 1, further comprising:
F. filling the STI opening with a second dielectric fill material, wherein the first and second dielectric fill materials completely fill the STI opening, and wherein the subsequent material has a same etch selectivity as the second dielectric fill material during etching of a masking layer.

3. The method of claim 1, further comprising:
performing a thermal oxidation process to form a first oxide layer at the walls of the STI opening when the semiconductor substrate is comprised of silicon, before step B.

4. A method of forming a STI (shallow trench isolation) structure, comprising:
A. forming a STI opening within a semiconductor substrate;
B. forming a liner layer comprised of an initial material at walls of the STI opening;
C. filling the STI opening with a first dielectric fill material;
D. performing an etch-back of the first dielectric fill material to expose an upper portion of the liner layer;
E. converting the exposed upper portion of the liner layer to be comprised of a subsequent material;
performing a thermal oxidation process to form a first oxide layer at the walls of the STI opening when the semiconductor substrate is comprised of silicon, before step B; and
forming a second oxide layer on the first oxide layer in a medium temperature oxide (MTO) deposition process, before step B;
wherein the liner layer is deposited on the second oxide layer in step B.

5. A method of forming a STI (shallow trench isolation) structure, comprising:
A. forming a STI opening within a semiconductor substrate;
B. forming a liner layer comprised of an initial material at walls of the STI opening;
C. filling the STI opening with a first dielectric fill material;
D. performing an etch-back of the first dielectric fill material to expose an upper portion of the liner layer;
E. converting the exposed upper portion of the liner layer to be comprised of a subsequent material;
performing a thermal oxidation process to form a first oxide layer at the walls of the STI opening when the semiconductor substrate is comprised of silicon, before step B; and
forming a second oxide layer on the liner layer in a medium temperature oxide (MTO) deposition process, after step B.

6. The method of claim 1, further comprising:
etching the STI opening through masking layers comprised of a layer of nitride and a layer of oxide deposited on the semiconductor substrate.

7. The method of claim 6, wherein the upper portion of the liner layer comprised of the subsequent material prevents formation of dents in the dielectric fill materials during etching of masking layers.

8. The method of claim 1, wherein the initial material of the liner layer is nitride, and wherein the subsequent material of the upper portion of the liner layer is oxide.

9. The method of claim 8, wherein the liner layer comprised of the initial material has a thickness in a range of from about 10 Å (angstroms) to about 100 Å (angstroms), and wherein the upper portion of the liner layer comprised of the subsequent material has a thickness in a range of from about 50 Å (angstroms) to about 500 Å (angstroms).

10. The method of claim 8, wherein step E includes:
oxidizing the exposed upper portion of the liner layer with a radical to convert the exposed upper portion of the liner layer into oxide.

11. The method of claim 10, wherein a source gas of a radical includes one of a mixture of hydrogen and oxygen or a mixture of hydrogen, oxygen, and hydrogen chloride.

12. The method of claim 10, wherein the step of oxidizing the exposed upper portion of the liner layer with a radical is performed with a pressure in a range of from about 1 milli-Torr to about 50 Torr and at a temperature in a range of from about 600° Celsius to about 1100° Celsius.

13. The method of claim 10, wherein the step of oxidizing the exposed upper portion of the liner layer with a radical is performed in one of a single type process or a batch type process.

14. The method of claim 1, wherein each of the first and second dielectric fill materials is comprised of one of HDP (high density plasma) oxide or USG (undoped silicate glass).

15. The method of claim 1, wherein the etch-back of step D is performed in a wet etch-back process using an etching solution comprised of one of LAL (low ammoniumfluoride liquid), SC-1 solution, or an HF solution.

16. The method of claim 4, further comprising:
F. filling the STI opening with a second dielectric fill material, wherein the first and second dielectric fill materials completely fill the STI opening.

17. The method of claim 4, further comprising:
etching the STI opening through masking layers comprised of a layer of nitride and a layer of oxide deposited on the semiconductor substrate, wherein the upper portion of the liner layer comprised of the subsequent material prevents formation of dents in the dielectric fill materials during etching of masking layers.

18. The method of claim 4, wherein the initial material of the liner layer is nitride, and wherein the subsequent material of the upper portion of the liner layer is oxide.

19. The method of claim 18, wherein step E includes:
oxidizing the exposed upper portion of the liner layer with a radical to convert the exposed upper portion of the liner layer into oxide.

20. The method of claim 19, wherein a source gas of a radical includes one of a mixture of hydrogen and oxygen or a mixture of hydrogen, oxygen, and hydrogen chloride.

21. The method of claim 5, further comprising:
F. filling the STI opening with a second dielectric fill material, wherein the first and second dielectric fill materials completely fill the STI opening.

22. The method of claim 5, further comprising:
etching the STI opening through masking layers comprised of a layer of nitride and a layer of oxide deposited on the semiconductor substrate, wherein the upper portion of the liner layer comprised of the subsequent material prevents formation of dents in the dielectric fill materials during etching of masking layers.

23. The method of claim 5, wherein the initial material of the liner layer is nitride, and wherein the subsequent material of the upper portion of the liner layer is oxide, and wherein step E includes:

oxidizing the exposed upper portion of the liner layer with a radical to convert the exposed upper portion of the liner layer into oxide.

24. The method of claim 23, wherein a source gas of a radical includes one of a mixture of hydrogen and oxygen or a mixture of hydrogen, oxygen, and hydrogen chloride.

* * * * *